United States Patent [19]

Bouadma et al.

[11] Patent Number: 4,692,207

[45] Date of Patent: Sep. 8, 1987

[54] PROCESS FOR THE PRODUCTION OF AN INTEGRATED LASER-PHOTODETECTOR STRUCTURE

[76] Inventors: Noureddine Bouadma, 17 rue du val de Marne, 94250 Gentilly; François Brillouet, 17 Rue der Fontaines, 92310 Sevres; Angelika Kampfer, 146 rue der Théâtre, 75015 Paris, all of France

[21] Appl. No.: 917,860

[22] Filed: Oct. 14, 1986

[30] Foreign Application Priority Data

Oct. 14, 1985 [FR] France ............... 85 15217

[51] Int. Cl.⁴ ............... H01L 21/306; B44C 1/22; C03C 15/00; C03C 25/06
[52] U.S. Cl. ............... 156/649; 156/643; 156/648; 156/652; 156/655; 156/659.1; 156/662; 357/16; 357/19; 357/30; 372/48; 372/50; 437/129; 437/5; 437/176
[58] Field of Search ............ 29/569 L, 572, 580; 357/15, 16, 17, 19, 29, 30, 55, 56; 372/4, 5, 7, 43, 44, 45, 46, 48, 49, 50; 148/1.5, 187; 156/643, 648, 649, 652, 655, 659.1, 662

[56] References Cited

U.S. PATENT DOCUMENTS 4,297,653 10/1981 Scifres et al. ............... 331/94.5
4,352,116 9/1982 Yariv et al. ............... 357/17

OTHER PUBLICATIONS

IEEE Proceedings Section A-I, vol. 131, No. 5, Partie H, Oct. 1984, pp. 299-303, Old Woking, Surrey, GB; H. Matsueda et al.: "An Optoelectronic Integrated Device", FIG. 3; pp. 299-300.
Patents Abstracts of Japan, vol. 8, No. 70, (E-235) [1507], Apr. 3, 1984; & JP-A-58 220 469, (Fujitsu K.K.), 22-12-1983, Resume.
Patents Abstracts of Japan, vol. 7, No. 272, (E-214) [1417], Dec. 3, 1983; & JP-A-58 154 286, (Fujitsu K.K.), 13-09-1986, Resume.
GaAs IC Symposium, Technical Digest, 1983, Phoenix, Ariz., 25-27 Oct. 1983, pp. 44-47, IEEE; M. E. Kim et al.: "GAAlAs/GaAs Integrated Optoelectronic Transmitter Using Selective MOCVD Epitaxy and Planar Ion Implantation", (FIG. 1; p. 45).
Applied Physics Letters, vol. 35, No. 1, Jul. 1979, pp. 16-18, American Institute of Physica; D. R. Scifres et al.: "Semiconductor Laser With Integral Light Intensity Detector", Resume; FIG. 1.
Electronics International, vol. 56, No. 18, Jun. 1983, pp. 89-90, New York, U.S.; C. Cohen: "Optoelectronic Chip Integrates Laser and Pair of FETs", En entier.
Applied Physics Letters, vol. 43, No. 4, Aug. 1983, pp. 345-347, New York, U.S.; O. Wada et al.: "Monolithic Integration of a Double Heterostructure Light-Emitting Diode and a Field-Effect Transistor Amplifier Using Molecular Beam Grown AlGaAs/GaAs", En entier.

Primary Examiner—William A. Powell
Attorney, Agent, or Firm—Pearne, Gordon, McCoy & Granger

[57] ABSTRACT

Process for producing an integrated laser-photodetector structure.

A buffer layer and a double heterostructure are deposited on a substrate. Part of the double heterostructure is etched to form a cleaved face and to free the buffer layer. On the latter is formed a photodetector, e.g. with the aid of a Schottky contact.

Application to the production of light sources for optical telecommunications.

5 Claims, 10 Drawing Figures

PROCESS FOR THE PRODUCTION OF AN INTEGRATED LASER-PHOTODETECTOR STRUCTURE

BACKGROUND OF THE INVENTION

The present invention relates to a process for the production of an integrated laser-photodetector structure.

The technical field of the invention is that of double heterostructure semiconductor lasers either of the conventional type, or of the quantum type (the latter generally being called "multiple quantum well") and with a ribbon-like junction geometry. A double heterostructure is constituted by a stack or pile of different semiconductor alloy films. The latter are deposited on a monocrystalline substrate, either by liquid or gaseous phase epitaxy, or by a molecular beam. The thickness of the active zone, where both the excitons and photons are produced, is approximately 100 nm for a conventional double heterostructure. It is reduced to about ten nanometers in the case of a quantum structure.

For lasers emitting between 0.8 and 0.9 μm, the films constituting the double heterostructure are of alloy $Ga_{1-x}Al_xAs$, whilst for lasers emitting between 1.3 and 1.65 μ the films are of alloy $Ga_{1-x}In_xAs_{1-y}P_y$.

In optical fiber telecommunications, which is the favoured field for semiconductor lasers, the power emitted by the lasers is sensitive to temperature fluctuations and to partial deterioration in the case of long operating periods. Therefore power stabilization of the laser emitter is necessary. This stabilization is obtained by a photodetector positioned behind the laser. The detected signal is injected into a feedback circuit making it possible to readjust the supply current of the laser. This detector which, like the laser, is mounted in the optical head must be accurately positioned in order to collect the maximum power. During its fitting, it may also be necessary to incline it in order to prevent instability of the emission by the reinjection of photons into the laser cavity.

Of late, numerous works have appeared on the integration of a laser and a photodetector. Two solutions have already been reported, namely monolithic integration and hybrid integration.

1. In the first of these methods, it is a question of producing a channel perpendicular to the ribbon, tape or strip of the laser by chemical or ionic etching of the double heterostructure, which makes it possible to separate the two components, namely the laser on one side and the photodetector on the other. The functions of these two components are differentiated by the polarity of the voltage applied to the p-n junction which they both have. The laser junction is polarized in the conductive direction (direct p-n), whilst the photodetector junction is polarized in the reverse direction. Two integration types are possible as a function of the coupling mode between the laser and the photodetector.

(a) Coupling Across a Guide

In this case, the double heterostructure is constituted on the one hand by the different conventional layers or films (first confinement layer, active layer, second confinement layer and contact layer) and on the other hand by a passive guide located beneath the first confinement layer. Its index has an intermediate value between that of the active zone and that of the confinement layer. Etching of the different layers is then stopped just below the active zone in the first confinement layer. Coupling between the two components takes place across the guide and is dependent on the thickness of the first confinement layer, as well as the profile of the opening produced. Such a coupling mode is described in the article by J. L. MERZ and L. R. LOGAN entitled "Integrated GaAs-GaAlAs injection laser and detector with etched reflector" published in Applied Physics Letters, vol. 30, No. 10, p 530, 15.5.1977 and in the article by P. D. WRIGHT, R. J. NELSON AND R. B. WILSON entitled "Monolithic Integration of InGaAsP Heterostructure Lasers and Electrooptical Devices" published in IEEE Journal of Quantum Electronics, vol. QE 18, No. 2, February 1982.

(b) Direct Coupling

The double heterostructure does not necessarily have a passive guide beneath the active layer. The opening made is sufficiently deep to eliminate any guided coupling between the laser and the detector. Two active layer sections then face one another, namely one for transmission and the other for detection. A device of this type is described in the article by O. WADA et al entitled "AlGaAs-GaAs Microcleaved Facet (MCF) Laser Monolithically integrated with photodiode", published in Electronic Letters, vol. 18, No. 5, 4.3.1982 and in the article by Yoshia Suzuki et al entitled "InP-/InGals 1.5 μm Region etching cavity laser" Jph. J. Appl. Phys., vol. 23, 1984.

2. The second method is that of hybrid integration. Such a solution is described in U.S. Pat. No. 4,297,653 "Hybrid semiconductor Laser/detectors" granted to D. R. SCIFRES et al. In this procedure, the laser is mounted on a machined, diffused silicon support for providing a detector in front of which is prepositioned the laser. Thus, a rigid laser-photodetector assembly is obtained.

Although they are satisfactory in certain respects, these methods suffer from certain disadvantages. In general terms, integrated laser-photodetector structures are mounted on the substrate side on a heat dissipator for reducing their operating temperature. The by no means negligible thermal resistance of these lasers assumes that they have a low threshold current in order to permit a continuous operation. Moreover, a good sensitivity of the feedback system (ratio for the variation of the photodetected current to that of the supply current of the laser) is desirable.

In the case of the solution using a passive guide, the threshold current is doubled compared with an insulated laser having two cleaved faces (6 kA/cm² instead of 3 kA/cm²). This structure also requires a very precise control of the etching of the mirrors so as to ensure that the optical guide is not etched. Authors who have reported on this method do not describe continuous characteristics. The sensitivity values measured are approximately 10%.

The integrated structure with direct coupling makes it possible to obtain relatively low threshold currents (approximately 40 mA) essentially due to the quality of the microcleaved faces. However, the sensitivity value remains low (approximately 1.5%), which is due to the low active detection surface (active layer thickness approximately 10 nm). The sensitivity is even lower in the case of double heterostructures with quantum layers or films (thickness approximately 10 mm) and sensitivity of approximately 0.045%.

The laser-photodetector hybrid structure provides the desired performance characteristics of good quality of the mirror faces of the lasers (cleaved faces) and high sensitivity of the detector (silicon detector). The limitations of this procedure relate to the hybridization causing problems of precision, reliability and fitting costs.

SUMMARY OF THE INVENTION

The object of the present invention is to obviate these disadvantages by proposing a laser-photodetector assembly monolithically integrated onto the same substrate and having a low threshold current and a high differential sensitivity. This object is achieved by using the same procedure for producing the laser ribbon, one of the reflecting faces of the laser and for locating the photodetector. The invention leads to a reliable assembly having high performance characteristics, whilst making it possible to reduce the costs of the optical heads for telecommunications.

The invention more specifically relates to a process for producing an integrated laser-photodetector structure, wherein on a substrate are deposited a buffer layer, followed by a double heterostructure having a first confinement layer, an active layer and a second confinement layer; part of the double heterostructure is etched to produce an uncleaved face serving as a reflecting face for the laser; a photodetector is produced in the vicinity of the laser and on the side of the uncleaved face, wherein in order to produce the photodetector, part of the double heterostructure is etched at least up to the buffer layer and the photodetector is produced on the thus freed buffer layer.

In a constructional variant, the photodetector is obtained by a Schottky contact. In another variant, the photodetector is a p-n junction.

The substrate can be planar or have a staircase profile, which makes it possible to raise the photodetector.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
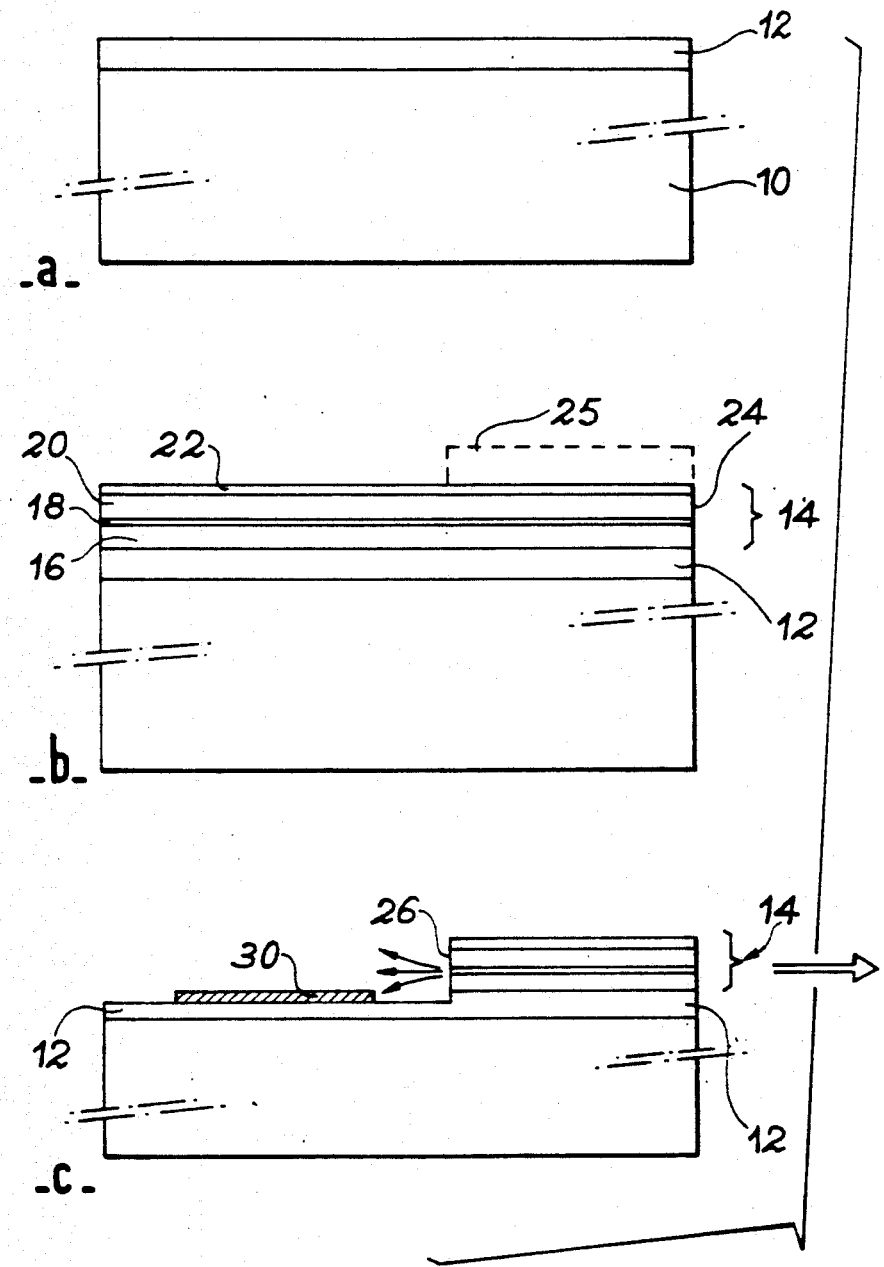
FIG. 1(a-c) is a first embodiment of the process according to the invention using a Schottky detector.

The description of the invention relates to GaAs-GaAlAs materials on a n+ substrate. This description extends directly to the lasers formed on the semiinsulating substrate and on materials such as InP-GaInAsP.

On a substrate 10 is firstly formed a n-type buffer layer 12 doped to $10^{16}$–$10^{17}$ cm$^{-3}$ (part a in FIG. 1), which is followed by the formation of a double heterostructure, i.e. a stack of the following layers or films:
a first n-doped confinement layer 16 of $Al_xGa_{1-x}As$ with x=0.3,
an undoped active layer 18 of $Al_yGa_{1-y}As$ with y≦0.1,
a second confinement layer 20 doped with $Al_xGa_{1-x}As$ with x=0.3,
a p+-doped GaAs layer 22.

In the case of quantum structures (x approximately 0.6), the active layer 18 is constituted by one or more wells with a thickness of approximately 10 nm.

The laser ribbon which laterally defines the guide limits is produced either during growth, or after growth (by proton implantation).

Face 24 of the double heterostructure is cleaved. A structure like that shown in sectional form in part b of FIG. 1 is obtained. An uncleaved face 26 is obtained by etching the materials through a mask 25 up to an adequate thickness for freeing the buffer layer 12. This etching can be chemical, ionic or reactive. The freed buffer layer will form the sensitive layer of the photodetector.

A Schottky detector is then produced to the rear of the uncleaved laser face 26 by depositing a metal layer 30. The latter can be of alloy Ti/Au. The laser-detector spacing is approximately 50 μm.

Figure 2:
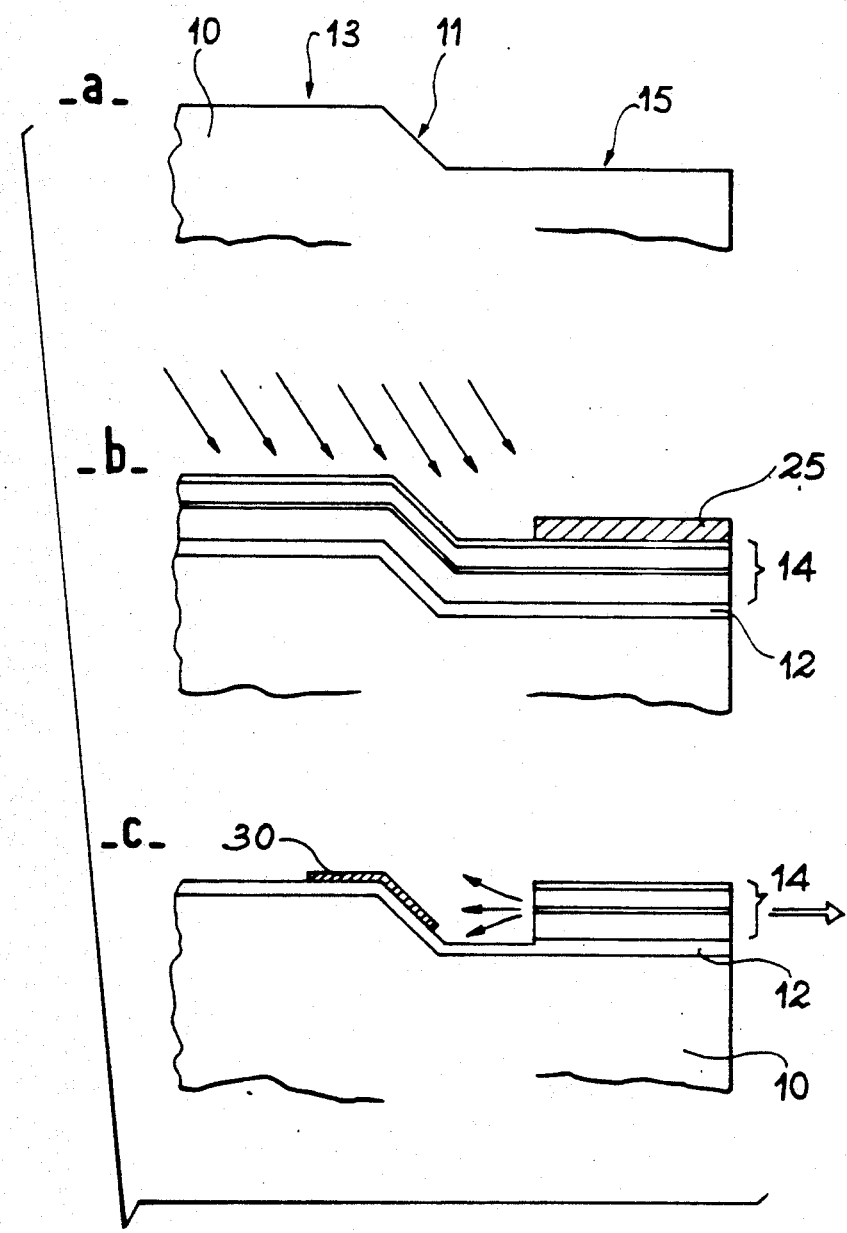
FIG. 2(a-c) is a variant in which the substrate has a staircase shape.

As shown in FIG. 2, it is also possible to start with a substrate 10 having a staircase configuration with a ramp 11 joining an upper stair 13 to a lower stair 15 (part a). The ramp angle can be 40° to 50°. This substrate can be produced by chemical or ionic etching. In this case, the double heterostructure 14 is deposited by organo-metallic chemical vapour deposition (OMCVD) or by molecular beam epitaxy (MBE). As in the preceding case, the layers deposited on the upper stair and on the inclined zone up to buffer layer 12 (part b of FIG. 2) are etched through a mask 25 deposited on part of the double heterostructure. A metallization 30 is then placed astride the upper stair and on the inclined zone.

Figure 3:
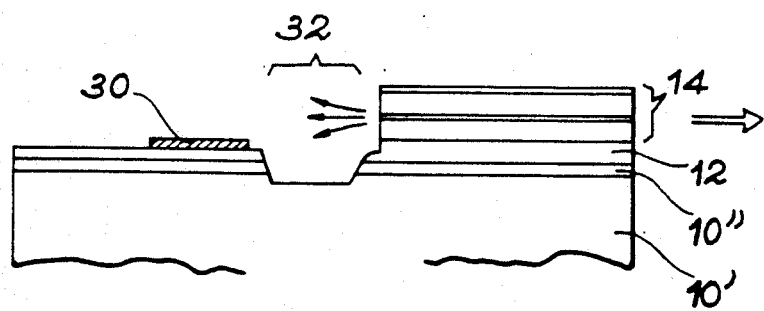
FIG. 3 is another embodiment using a semiinsulating substrate.

The invention can also apply to the case of a semiinsulating substrate, as illustrated in FIG. 3. This substrate 10' is surmounted by a n+-doped layer 10''. Etching of the double heterostructure is continued up to the substrate in the interpolated zone 32, in order to electrically insulate the laser from the photodetector.

Figure 4:
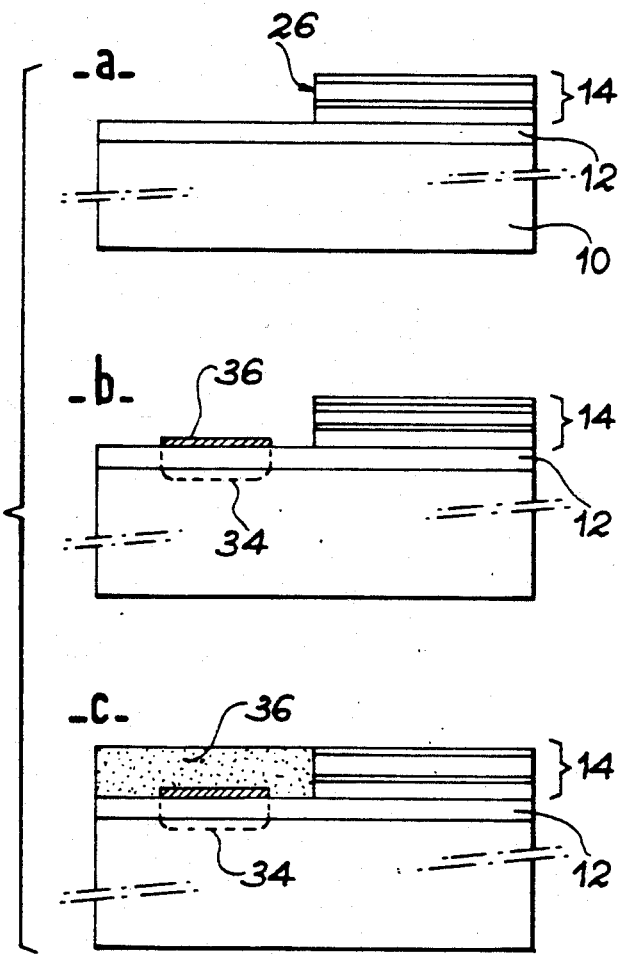
FIG. 4(a-c) is a variant in which the photodetector is a p-n junction.

In the previous examples, the photodetector has been formed by a Schottky contact, but the invention is not limited thereto. It is also possible to produce a p-n junction, as illustrated in FIG. 4.

The first stage (a) is the same as hereinbefore, except that the etched face 26 of the laser is produced prior to the formation of the ribbon and the metallizations. Implantation and annealing, or a selective diffusion of a p-type impurity, are then carried out on the buffer layer 12 in zone 34. Metallization 36 is then obtained by the lift off method (4b).

The laser ribbon is then formed e.g. by implantation by protons by masking with a resin 36 the entire region of the detector up to the apex of the machined face (FIG. 4c).

This sequence of operations can be carried out both on a plane (as illustrated) and on a step (as shown in FIG. 2). In the same way, the substrate can be semiconducting or semiinsulating (as in FIG. 3).

In the above examples, substrate 10 and buffer layer 12 serving as the photodetector are of GaAs. When using an InP substrate, it is necessary to epitaxy an InGaAsP layer, whose forbidden band width is equal to or below that of the active layer and this must take place before the InP confinement layer undergoes epitaxy.

What is claimed is:
1. A process for producing an integrated laser-photodetector structure, wherein on a substrate are deposited a buffer layer, followed by a double heterostructure having a first confinement layer, an active layer and a second confinement layer; part of the double heterostructure is etched to produce an uncleaved face serving as a reflecting face for the laser; a photodetector is produced in the vicinity of the laser and on the side of the uncleaved face, wherein in order to produce the photodetector, part of the double heterostructure is etched at least up to the buffer layer and the photodetector is produced on the thus freed buffer layer.

2. A process according to claim 1, wherein on the thus freed buffer layer is deposited a metal layer forming with said buffer layer a Schottky detector.

3. A process according to claim 1, wherein a zone of the thus freed buffer layer is doped with an impurity of a doping type opposite to that of the substrate and then a metal layer is deposited on the thus doped zone to form a junction photodetector.

4. A process according to either of the claims 2 and 3, wherein the double heterostructure is deposited on a staircase-like substrate with an upper step and a lower step, connected by an inclined zone, the laser being constituted on the lower step and the photodetector partly on the upper step and on the inclined zone.

5. A process according to either of the claims 2 and 3, wherein with the substrate being semiinsulating and covered by a doped layer, the etching of the double heterostructure is continued into a zone located between the laser and the photodetector up to the semiinsulating substrate.

* * * * *